(12) United States Patent
Montgomery

(10) Patent No.: US 8,106,446 B2
(45) Date of Patent: Jan. 31, 2012

(54) TRENCH MOSFET WITH DEPOSITED OXIDE

(75) Inventor: Robert Montgomery, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/080,453

(22) Filed: Apr. 3, 2008

(65) Prior Publication Data

US 2008/0185642 A1    Aug. 7, 2008

Related U.S. Application Data

(62) Division of application No. 11/261,896, filed on Oct. 28, 2005, now Pat. No. 7,371,641.

(60) Provisional application No. 60/623,679, filed on Oct. 29, 2004.

(51) Int. Cl.
    *H01L 31/119*      (2006.01)

(52) U.S. Cl. .................... 257/330; 257/328; 257/329

(58) Field of Classification Search ........... 257/328–330
See application file for complete search history.

(56) References Cited

U.S. PATENT DOCUMENTS

| | | | |
|---|---|---|---|
| 6,051,468 A | 4/2000 | Hshieh | |
| 6,291,298 B1 | 9/2001 | Williams et al. | |
| 6,674,124 B2 * | 1/2004 | Hshieh et al. | 257/330 |
| 6,809,374 B2 | 10/2004 | Takemori et al. | |
| 6,809,375 B2 | 10/2004 | Takemori | |
| 2002/0195657 A1 * | 12/2002 | Williams et al. | 257/332 |
| 2003/0085422 A1 | 5/2003 | Amali et al. | |
| 2004/0031987 A1 * | 2/2004 | Henninger et al. | 257/328 |

FOREIGN PATENT DOCUMENTS

| | | |
|---|---|---|
| JP | 2002-299619 | 10/2002 |
| JP | 2003-505886 | 2/2003 |
| JP | 2003-92406 | 3/2003 |
| JP | 2004-31959 | 1/2004 |
| JP | 2004-111663 | 4/2004 |

* cited by examiner

*Primary Examiner* — Samuel Gebremariam
(74) *Attorney, Agent, or Firm* — Farjami & Farjami LLP

(57) ABSTRACT

A trench type power semiconductor device which includes deposited rather than grown oxide in the trenches for the electrical isolation of electrodes disposed inside the trenches from the semiconductor body.

16 Claims, 9 Drawing Sheets

TRENCH MOSFET WITH DEPOSITED OXIDE

RELATED APPLICATION

This application is a division of U.S. patent application Ser. No. 11/261,896, filed Oct. 28, 2005, entitled The Method of Making a Trench MOSFET With Deposited Oxide which application is based on and claims benefit of U.S. Provisional Application Ser. No. 60/623,679, filed on Oct. 29, 2004, entitled Trench MOSFET Structures Using Deposited Oxide With Spacers, to which a claim of priority is hereby made and the disclosure of which is incorporated by reference.

BACKGROUND OF THE INVENTION

The present invention relates to semiconductor devices and more particularly to trench type power semiconductor devices.

A typical trench type power semiconductor device includes a gate structure, which is supported inside a trench. The gate structure includes a conductive gate electrode insulated from the semiconductor body of the device by an insulation body, which is typically silicon dioxide.

It is well known that a high electric field at the bottom of the trench can compromise the integrity of the device. To overcome this problem, a thick oxide is formed at the bottom of the trench below the gate electrode.

A conventional method for fabricating the thick oxide is by oxidation of the silicon. Oxidation, however, is time consuming, which is costly. In addition, oxidation consumes the silicon. As a result, the cell pitch of the device is adversely affected, thereby adversely affecting the current carrying capability per unit area of the device.

SUMMARY OF THE INVENTION

It is an object of the present invention to improve upon the prior devices and fabrication techniques.

A power semiconductor device according to one embodiment of the present invention includes a semiconductor body having a drift region of one conductivity, and a channel region of another conductivity over the drift region, a gate trench formed in the semiconductor body through at least the channel region, an oxide body disposed at the bottom of the gate trench, a gate electrode formed over the oxide body, and a gate oxide interposed between the sidewalls of the gate trench and the gate electrode.

According to one aspect of the present invention the oxide body is a depositable silicon dioxide (e.g. TEOS); whereas, the gate oxide is grown using an oxidation technique. Thus, in a device according to the present invention the oxide body is less dense than the gate oxide.

According to another aspect of the present invention, a device according to the present invention includes a field relief trench, a field oxide body having a recess, and a T-shaped electrode received at least partially in the recess. The T-shaped electrode extends below the depth of the gate electrode, and is electrically connected to a power electrode of the device in order to improve the breakdown voltage of the device.

It should be noted that the oxide body, and the field oxide body are both preferably formed from the same depositable oxide (e.g. TEOS) and are both thicker than the gate oxide.

To fabricate a device according to the present invention a trench is formed in a semiconductor body, an oxide body is deposited at the bottom of the trench, and an electrode is formed over the oxide body.

According to another aspect of the present invention, spacers inside the trench are used to form the recess that enables the extension of the field relief electrode below the depth of the gate electrode.

Other features and advantages of the present invention will become apparent from the following description of the invention which refers to the accompanying drawings.

DETAILED DESCRIPTION OF EMBODIMENTS OF THE INVENTION

Figure 1:
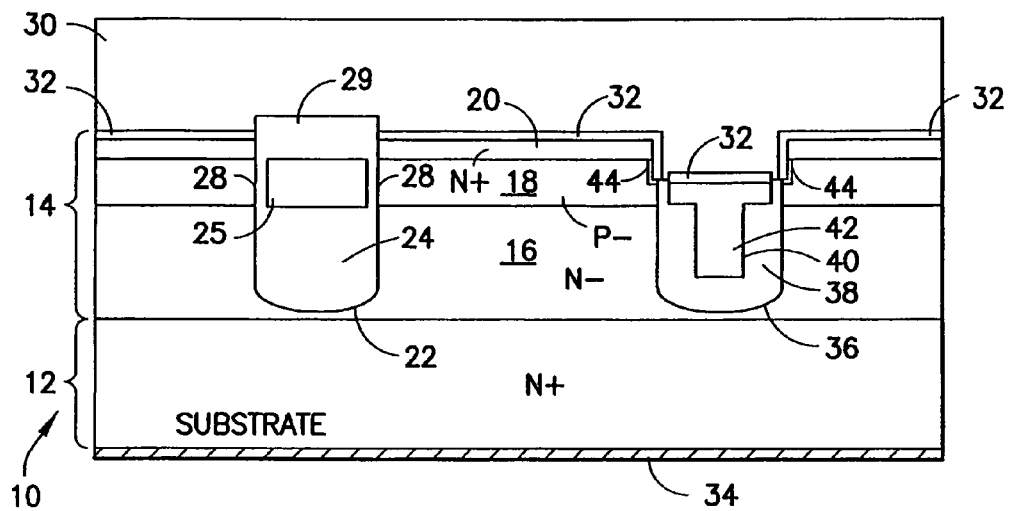
FIG. 1 illustrates a cross-sectional view of an active cell of a device according to an embodiment of the present invention.

Referring to FIG. 1, a power semiconductor device according to the present invention includes semiconductor body 10. Semiconductor body 10 preferably includes semiconductor substrate 12, which may be a float-zone type, single crystal, silicon, and an epitaxially grown semiconductor body 14, for example, epitaxially formed silicon, formed over substrate 12. Epitaxially grown semiconductor body 14 includes drift region 16, channel region (sometimes referred to as body region) 18, and conductive region 20 over channel region 18. As is well known in the art, drift region 16, and conductive region 20 are of one conductivity, while channel region 18 is of another, opposite conductivity. Thus, when drift region 16, and conductive region 20 are of N-type conductivity, channel region 18 is of the P-type variety, and when drift region 16, and conductive region 20 are of P-type conductivity, channel region 18 is of the N-type variety.

A power semiconductor device according to the preferred embodiment is a vertical conduction type power MOSFET. Thus, substrate 12 is of the same conductivity as drift region 16, although usually it is more highly doped compared to drift region 16. As an example, FIG. 1 illustrates a vertical conduction type power MOSFET in which drift region 16 is N-type and channel region 18 is P-type, i.e. an N-channel device. A P-channel device can be obtained by reversing the polarity of each region in an N-channel device.

A device according to the present invention includes gate trench 22, which extends through at least channel region 18. According to the present invention an oxide (e.g. silicon dioxide body) body 24 resides at the bottom of gate trench 22. Gate electrode 25 (formed for example from conductive polysilicon) is spaced from channel region 16 by gate oxides 28 interposed between the sidewalls of gate trench 22 and channel region 18. According to one aspect of the present invention oxide body 24 is deposited; whereas gate oxides 28 are grown. For example, in the preferred embodiment, oxide body 24 is deposited TEOS; whereas gate oxides 28 are grown through a gate oxidation process. Consequently, oxide body 24 according to one aspect of the present invention is less dense than gate oxides 28.

A device according to the present invention further includes first power electrode 30 (formed, for example, with Al or AlSi), which is electrically connected to conductive region 20 through, preferably, a silicided body 32 disposed over conductive region 20. A second power electrode 34 (formed, for example, with Al or AlSi) is electrically connected to substrate 12. In the preferred embodiment, first power electrode 30 is the source electrode, while second power electrode 34 is the drain electrode.

According to another aspect of the present invention, a device according to the present invention further includes field relief trench 36 which extends into drift region 16. Field relief trench 36 supports field oxide body 38 at the bottom thereof. Field oxide 38 is preferably formed from the same oxide as oxide body 24 (e.g. TEOS), and include recess 40. A preferably T-shaped field electrode 42 (formed, for example, with conductive polysilicon) resides inside and fills recess 40 and extends outside of recess 40 and laterally over field oxide 38. First power electrode 30 is electrically connected to field electrode 42 through silicide body 32. Preferably, high conductive regions 44 of the same conductivity as channel region 18 are formed on the sidewalls of field relief trench 36 in order to reduce the contact resistance between silicide body 32 and channel region 18 in order to reduce the possibility of activating parasitic devices due to for example, leakage current or the like. Field relief electrode 42 functions to improve the breakdown capability of the device, thereby allowing for the reduction of the resistance of drift region 16 either by reducing its thickness (which may also reduce the cost of the device) or its dopant concentration. It should also be noted that in the preferred embodiment a portion of first power electrode is received inside field relief trench 36. It should further be noted that oxide body 24 and field oxide body 38 are thicker than gate oxide 28.

Figure 2A:
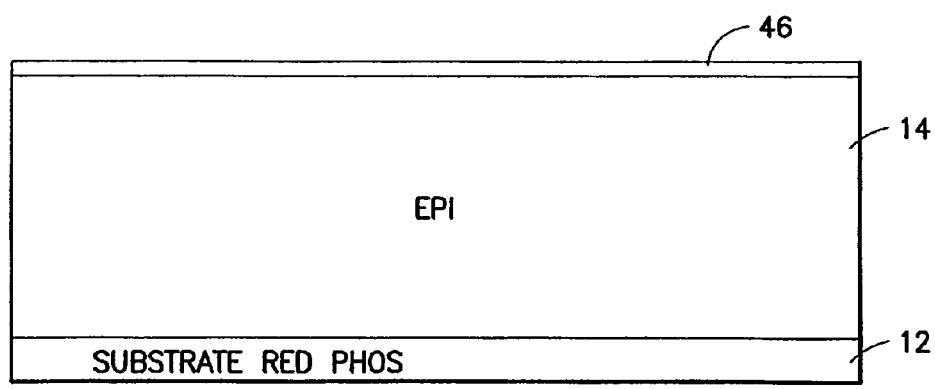
FIGS. 2A-2Q graphically illustrate a method for fabricating a device according to the present invention.
Figure 2B:
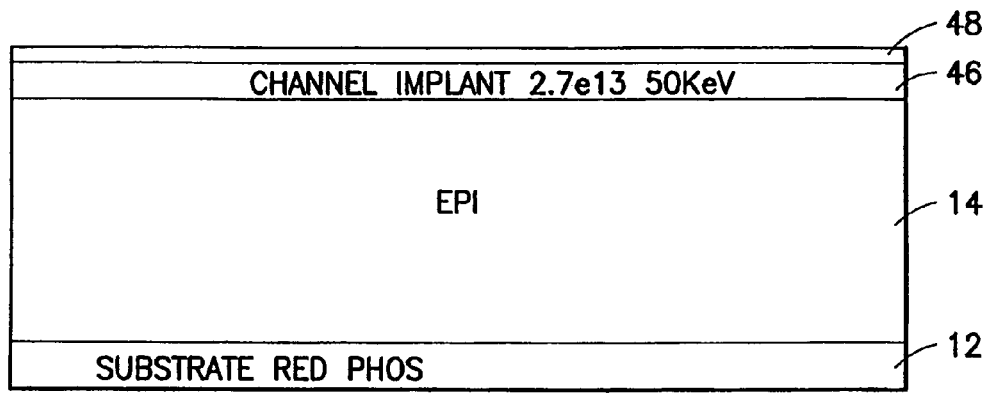
Figure 2C:
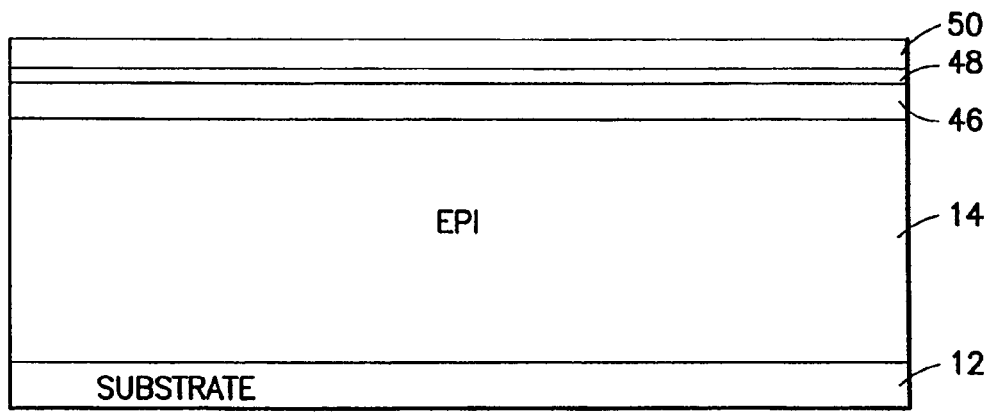
Figure 2D:
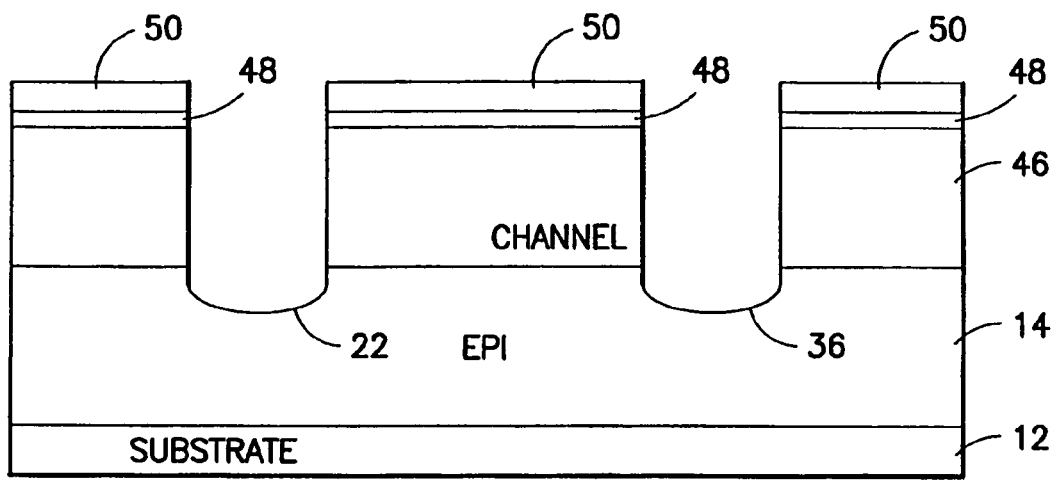
Figure 2E:
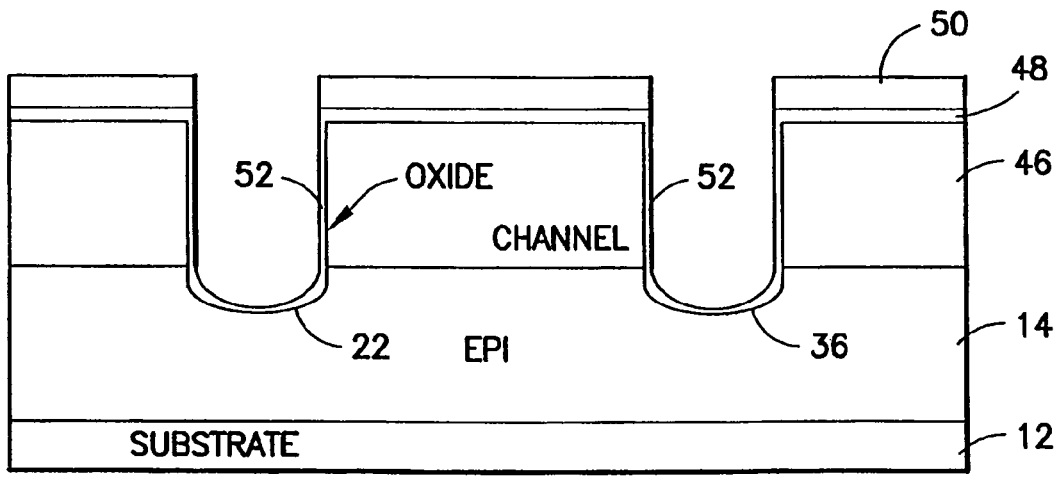
Figure 2F:
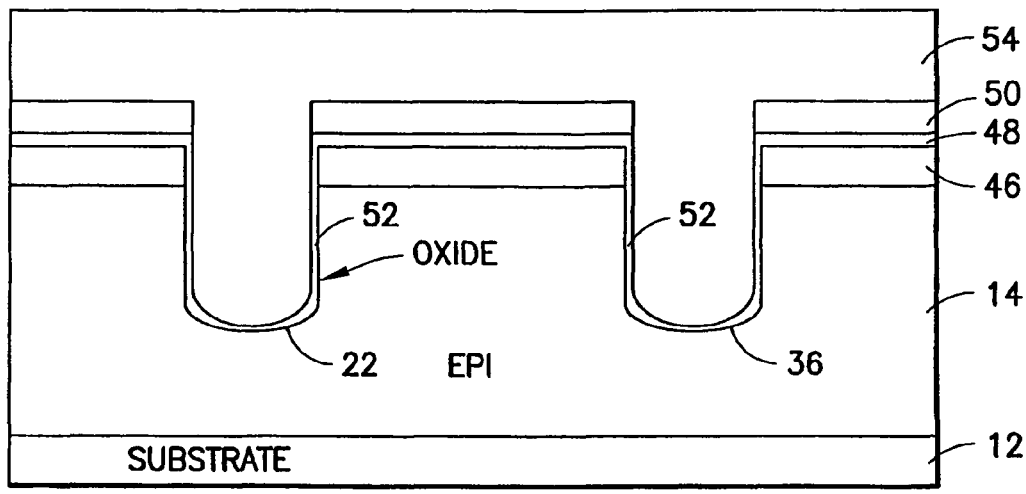
Figure 2G:
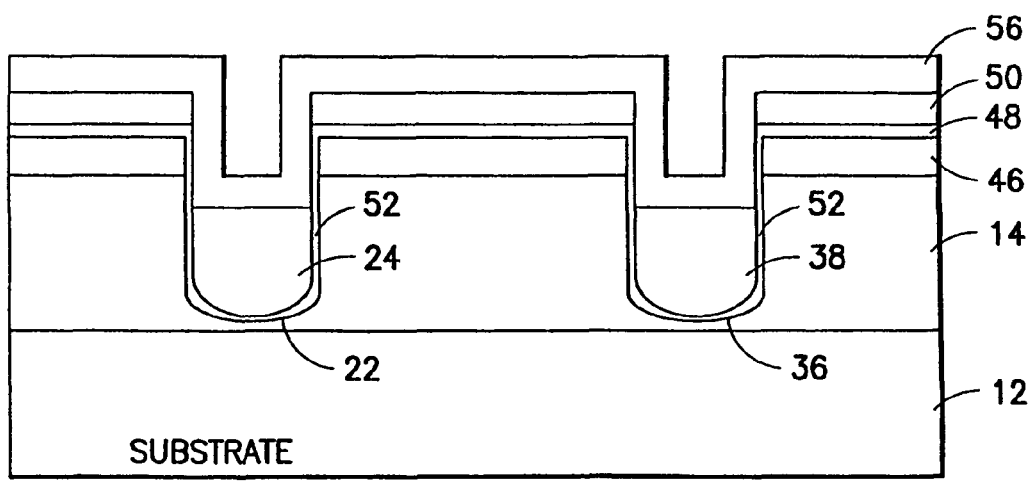
Figure 2H:
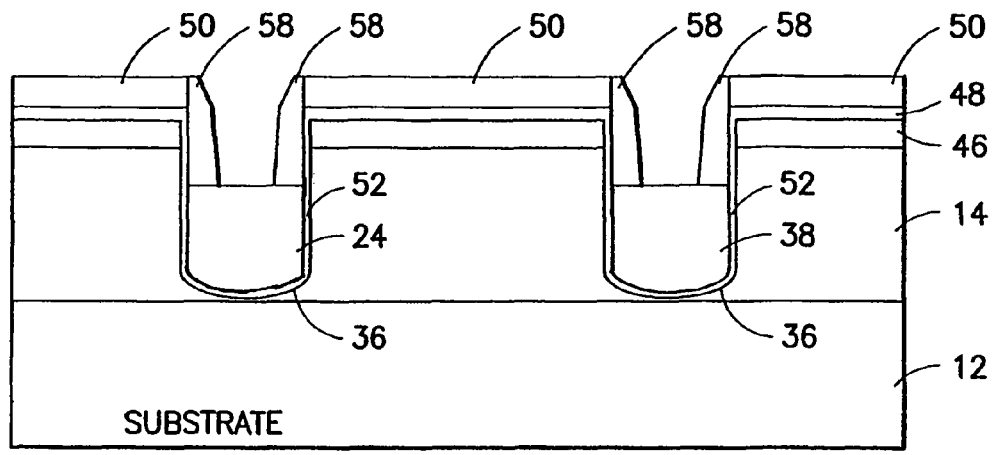
Figure 2I:
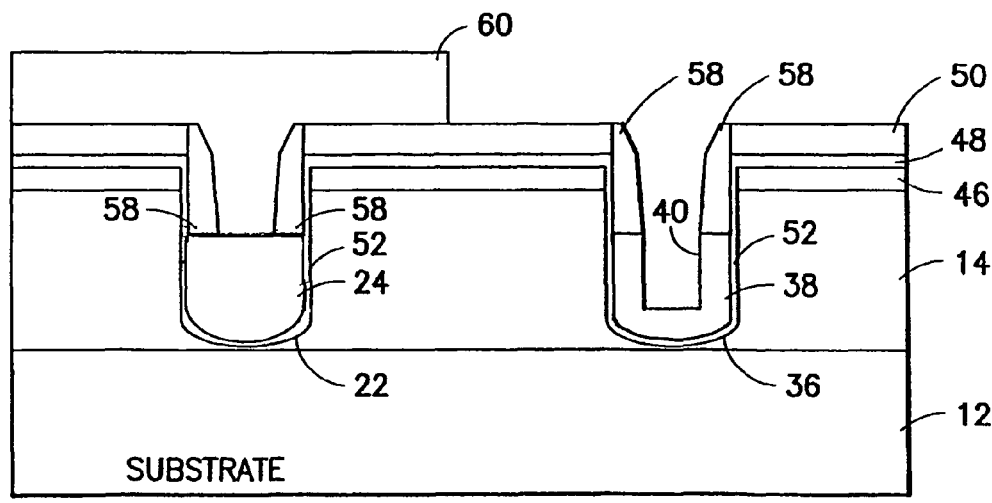
Figure 2J:
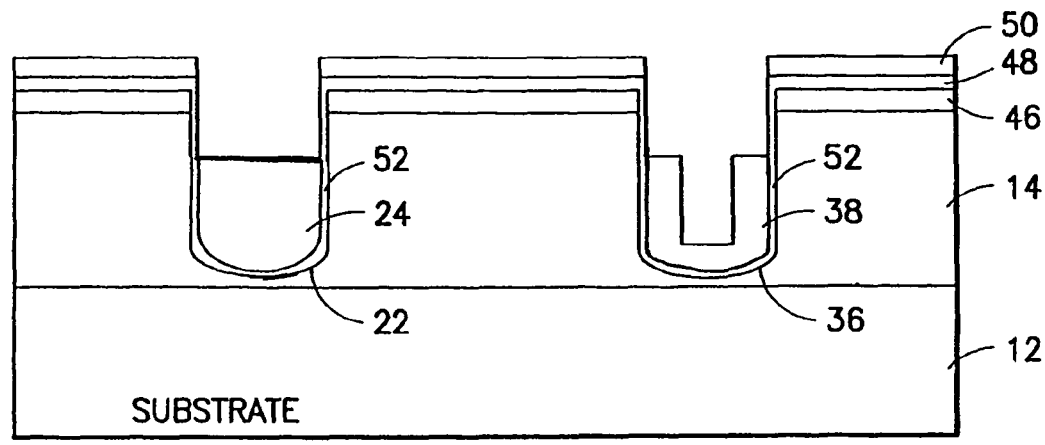
Figure 2K:
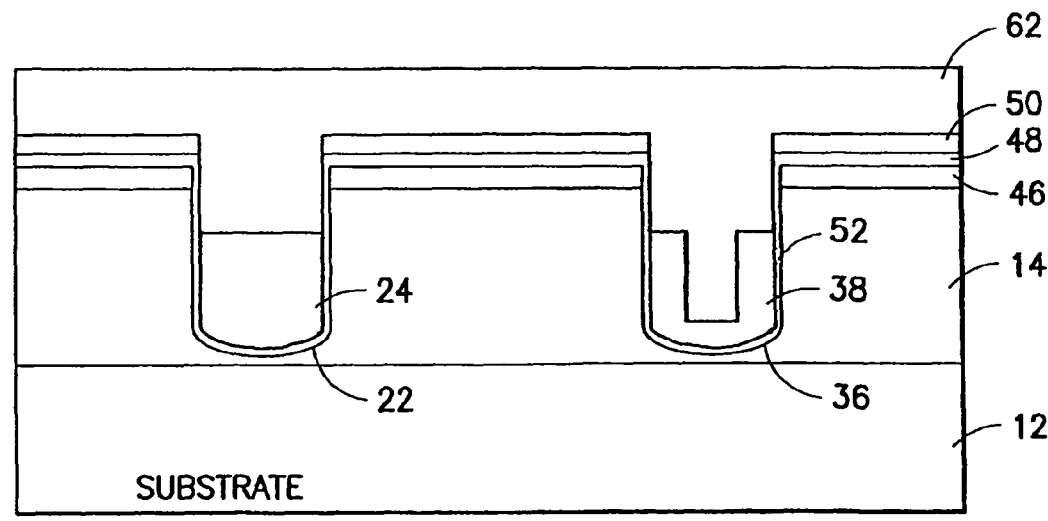
Figure 2L:
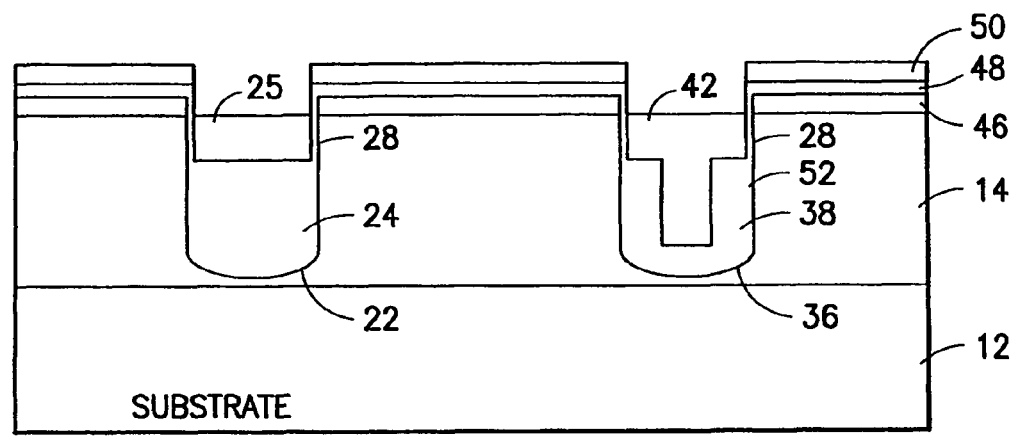
Figure 2M:
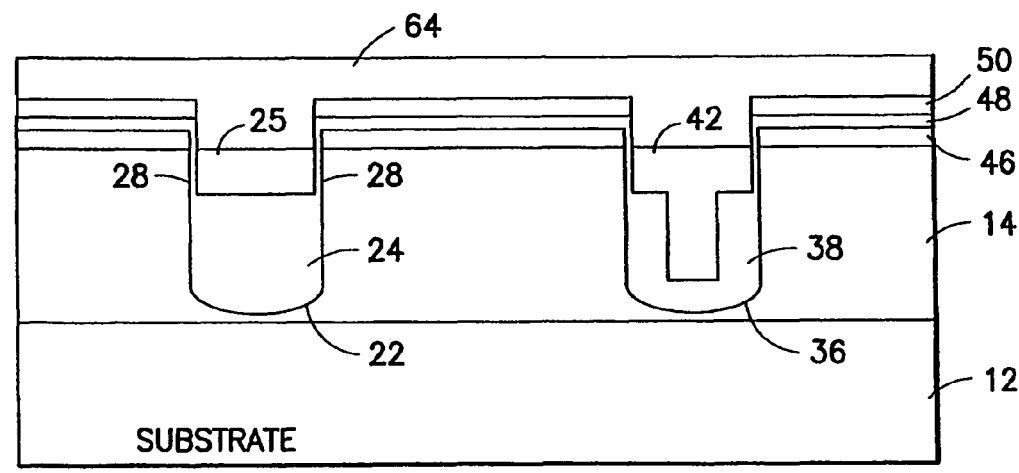
Figure 2N:
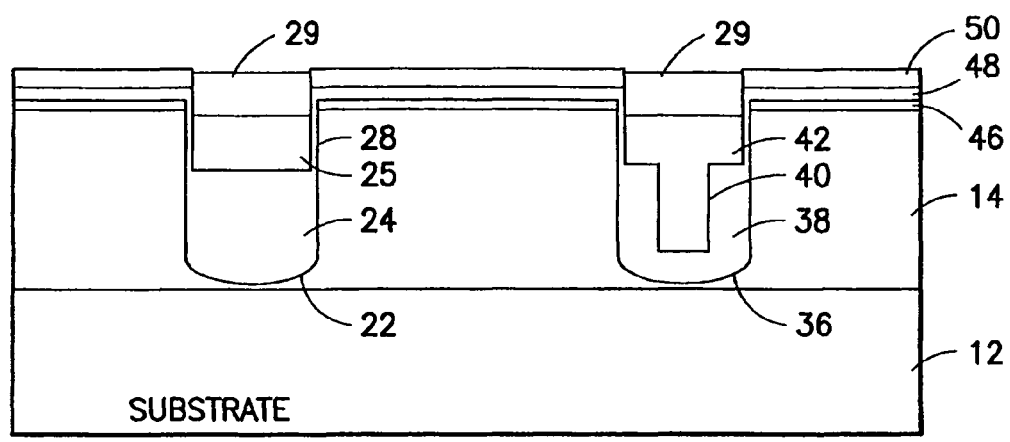
Figure 2O:
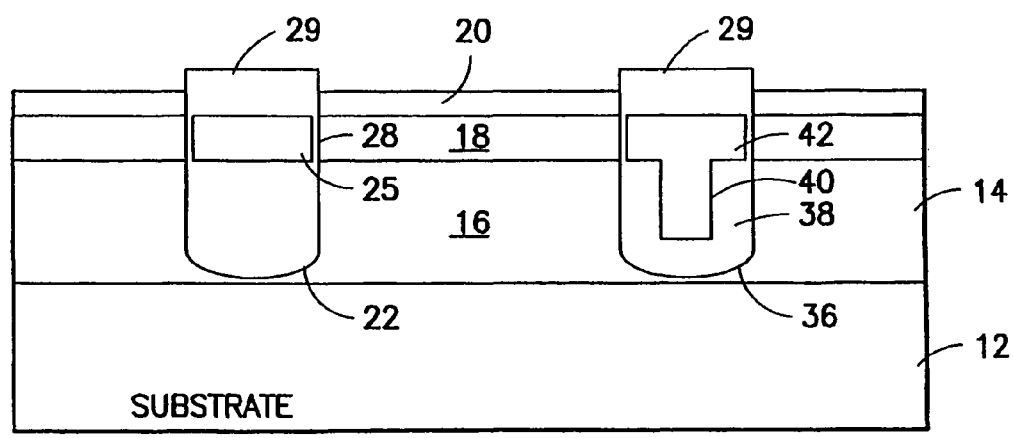
Figure 2P:
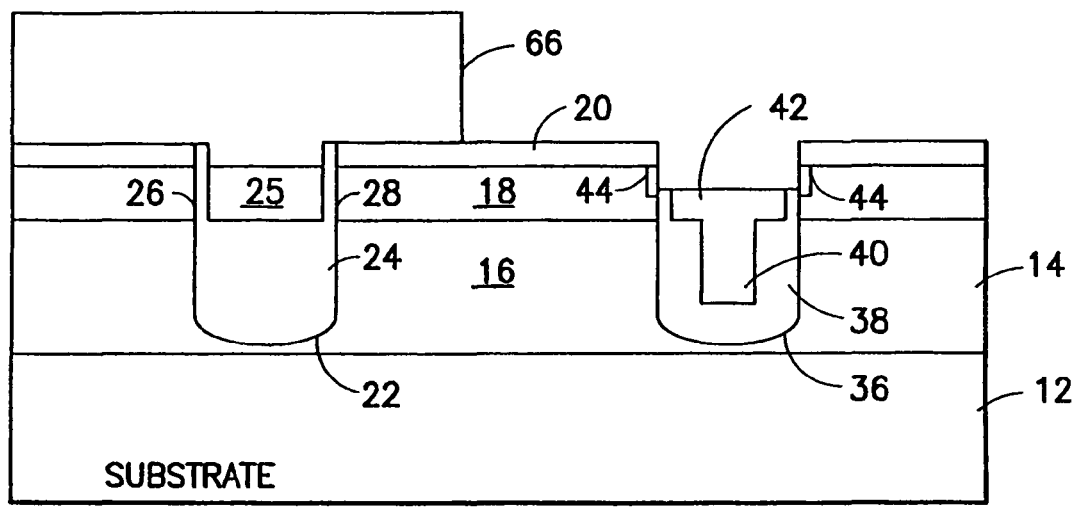
Figure 2Q:
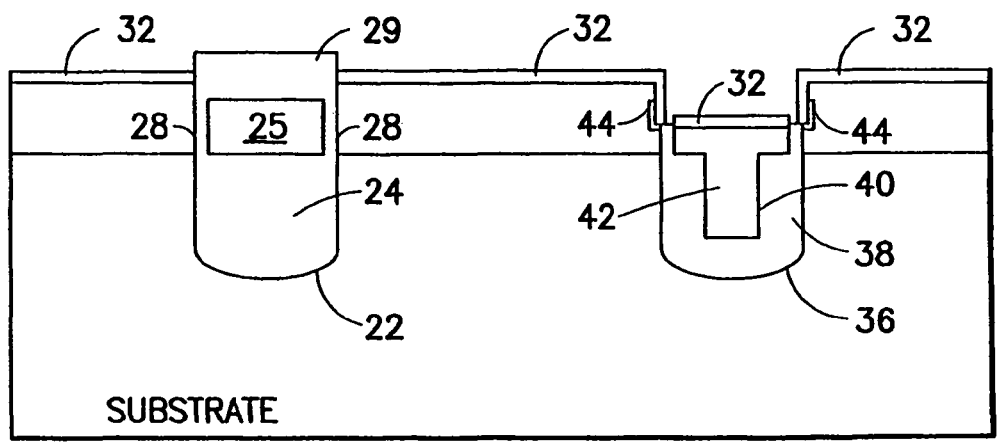

Referring to FIGS. 2A-2Q, a device according to the present invention is fabricated as follows. Initially, as illustrated by FIG. 2A, pad oxide 48 is grown over epitaxially grown semiconductor 14 (e.g., N-type Si), which is disposed over a semiconductor substrate 12 (e.g., N+ type Si). Preferably, substrate 12 is doped with red phosphorus.

Next, channel dopants are implanted into epitaxially formed silicon 14 to form channel implant region 46 (FIG. 2B). Next, a hard mask 50, preferably formed from a nitride, is formed over pad oxide 48 (FIG. 2C), and is patterned to designate areas of epitaxially grown semiconductor 14 that are to be etched to form trenches. Thereafter, epitaxially grown semiconductor 14 is etched to create gate trench 22 and field relief trench 36 as illustrated by FIG. 2D.

Next, sacrificial oxide 52 is grown over the sidewalls and the bottoms of trenches 22, 36 (FIG. 2E), and an oxide such as TEOS 54 is deposited to fill trenches 22, 36 as illustrated by FIG. 2F. Thereafter, TEOS 54 is removed leaving only oxide body 24, and field oxide body 38. Another nitride layer 56 is then deposited as illustrated in FIG. 2G. Nitride layer 56 is then etched away leaving nitride spacers 58 as seen in FIG. 2H.

Next, gate protection mask 60 is formed over gate trench 22, and field oxide body 38 is etched to form recess 40 therein as seen in FIG. 2I. Thereafter, mask 60, and nitride spacers 56 are removed to obtain the structure seen in FIG. 2J. Then, pad oxide 52 is removed from the sidewalls of trenches 22, 36, the exposed sidewalls are oxidized in a gate oxidation process to form gate oxides 28, and conductive polysilicon 62 is deposited to fill trenches 22, 36 as seen in FIG. 2K. Polysilicon 62 is then removed leaving only gate electrode 25, and field relief electrode 42 as illustrated in FIG. 2C. Thereafter, another layer of TEOS 64 is deposited (FIG. 2M) filling the space above gate electrode 25, and the space above field relief electrode 42. Then TEOS 64 is etched leaving only insulation cap 29 over gate electrode 25, and field relief electrode 42 as seen in FIG. 2N.

Referring next to FIG. 2O, nitride mask 50, and pad oxide 48 are removed, and then dopants for forming conductive region 20 are implanted. Thereafter, the dopant in channel implant region 46 and implants for forming conductive region 20 are driven in a diffusion drive to obtain drift region 16, channel region 18, and conductive region 20.

Next, gate protection mask 66 is formed over gate trench 22, and oxide cap 29 in field relief trench 36 is removed. In addition, portions of the top of field relief electrode 42, and the oxide adjacent to the removed portion are etched away, whereby channel region 18 is exposed through the sidewalls of field relief trench 36 above field relief electrode 42. Using an angled implant technique dopants of the same conductivity as channel region 18 are implanted into the exposed sidewalls of field relief trench 36 and driven in a diffusion drive to high conductivity regions 44 as seen in FIG. 2P.

Thereafter, gate protection mask 66 is removed, and silicide body 32 is formed in a conventional silicide process to obtain the structure shown by FIG. 2Q. Thereafter, first power electrode 30 and second power electrode 34 are formed by any known method such as sputtering or the like to obtain a device according to the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
    a semiconductor body having a drift region of one conductivity, and a channel region of another conductivity over said drift region;
    a gate trench formed in said semiconductor body through at least said channel region, said gate trench including sidewalk and a bottom wall;
    an oxide body disposed at the bottom of said trench;
    a gate electrode formed over said oxide body;
    gate oxide interposed between said sidewalls of said trench and said gate electrode, wherein said oxide body is less dense than said gate oxide;
    a field relief trench, said field relief trench including a field oxide body having a recess, and a T-shaped electrode received at least partially in said recess;
    at least one highly conductive region of said another conductivity formed directly on at least a sidewall of said field relief trench;
    a source region adjacent said gate trench and said field relief trench, said source region situated between said gate trench and said field relief trench; and
    a source electrode electrically connected to said T-shaped electrode and said source region.

2. The power semiconductor device of claim 1, wherein said oxide body is comprised of TEOS.

3. The power semiconductor device of claim 1, wherein said oxide body is deposited and said gate oxide is grown.

4. The power semiconductor device of claim 1, further comprising a silicide body interposed between said semiconductor body and said source electrode.

5. The power semiconductor device of claim 1, further comprising an oxide cap disposed over said gate electrode.

6. A power semiconductor device comprising:
    a semiconductor body having a drift region of one conductivity, and a channel region of another conductivity over said drift region;
    a gate trench formed in said semiconductor body through at least said channel region, said gate trench including sidewalls and a bottom wall;
    an oxide body disposed at the bottom of said trench;
    a gate electrode formed over said oxide body;

gate oxide interposed between said sidewalls of said trench and said gate electrode, wherein said oxide body is less dense than said gate oxide;

a field relief trench having a field oxide body, and a field electrode disposed therein, and at least one highly conductive region of the same conductivity as said channel region formed directly on at least a sidewall of said field relief trench, and a power electrode into said field relief trench and electrically connected to said field electrode and said at least one highly conductive region inside said field relief trench.

7. A power semiconductor device comprising:

a semiconductor body having a drift region of one conductivity, and a channel region of another conductivity over said drift region;

a gate trench formed in said semiconductor body through at least said channel region, said gate trench including sidewalls and a bottom wall;

a gate electrode situated in said gate trench;

a field relief trench, said field relief trench including a field electrode situated in said field relief trench;

a highly conductive region of said one conductivity adjacent said gate trench and said field relief trench, said highly conductive region of said one conductivity situated between said gate trench and said field relief trench;

another highly conductive region of said another conductivity formed directly on at least a sidewall of said field relief trench; and a power electrode electrically connected to said field electrode and said highly conductive region of said one conductivity.

8. The power semiconductor device of claim 7, wherein said field electrode comprises a T-shaped electrode received at least partially in a recess formed in a field oxide body situated in said field relief trench.

9. The power semiconductor device of claim 7, further comprising a silicide body interposed between said highly conductive region of said one conductivity and said power electrode.

10. The power semiconductor device of claim 7, further comprising a silicide body interposed between said field electrode and said power electrode.

11. The power semiconductor device of claim 7, wherein said highly conductive region of said one conductivity is a source region of said power semiconductor device, and said power electrode is a source electrode.

12. The power semiconductor device of claim 7, further comprising at least one highly conductive region of said another conductivity formed along a sidewall of said field relief trench, said power electrode being further electrically connected to said at least one highly conductive region of said another conductivity.

13. The power semiconductor device of claim 7, further comprising an oxide cap disposed over said gate electrode.

14. The power semiconductor device of claim 7, further comprising:

an oxide body disposed at the bottom of said gate trench, said oxide body situated beneath said gate electrode; and a gate oxide interposed between said sidewalls of said gate trench and said gate electrode;

said oxide body being less dense than said gate oxide.

15. The power semiconductor device of claim 14, wherein said oxide body comprises TEOS.

16. The power semiconductor device of claim 14, wherein said oxide body is deposited and said gate oxide is grown.

* * * * *